United States Patent [19]

Harris

[11] Patent Number: 5,436,598

[45] Date of Patent: Jul. 25, 1995

[54] PHASE LOCK LOOP CIRCUIT FOR SIGNALS PERIODICALLY INVERTING IN PHASE

[75] Inventor: Andrew M. Harris, Phoenix, Ariz.

[73] Assignee: Calcomp Inc., Anaheim, Calif.

[21] Appl. No.: 184,687

[22] Filed: Jan. 21, 1994

[51] Int. Cl.[6] .............................................. H03L 7/06
[52] U.S. Cl. ..................................... 331/11; 331/1 A; 331/14; 331/17
[58] Field of Search ..................... 331/1 A, 11, 14, 17, 331/25, DIG. 2; 375/81, 82, 83, 84, 87; 345/156, 180, 181

[56] References Cited

U.S. PATENT DOCUMENTS

| | | | |
|---|---|---|---|
| 4,400,667 | 8/1983 | Belkin | 331/1 A |
| 4,787,097 | 11/1988 | Rizzo | 375/120 |
| 5,170,135 | 12/1992 | Ito et al. | 331/1 A |

*Primary Examiner*—Robert J. Pascal
*Assistant Examiner*—David Vu

*Attorney, Agent, or Firm*—Wm. F. Porter, Jr.; Robert M. Wallace

[57] ABSTRACT

A phase lock loop (PLL) circuit which includes an input for inputting an incoming signal which is to be tracked, a phase lock loop subcircuit, a phase state indicator subcircuit, and a synchronized blanking window generator. These elements create a phase lock loop circuit capable of producing a stable output which closely tracks the incoming signal, even when the incoming signal shifts in phase by 180 degrees. The phase state indicator subcircuit detects a phase reversal in the incoming signal and outputs a signal indication such. This indicating signal is used by the phase lock loop subcircuit to produce a stable reference signal tracking the incoming signal most of the time. However, during a short period of time between the inversion of the incoming signal and the output of the indicating signal by the phase state indicator subcircuit, the synchronized blanking window generator provides a signal to the phase lock loop subcircuit which is used to stabilize the reference signal.

14 Claims, 3 Drawing Sheets

FIG. 2A LOOP X-OR OUT

FIG. 2B INCOMING SIGNAL

FIG. 2C PHASE STATE X-OR OUT

FIG. 2D CAPACITOR OUT

FIG. 2E COMPARATOR OUT

FIG. 2F FLIP-FLOP OUT

FIG. 3A INTEGRATOR OUT

FIG. 3B SYNCHRONIZED BLANKING WINDOW GENERATOR OUT

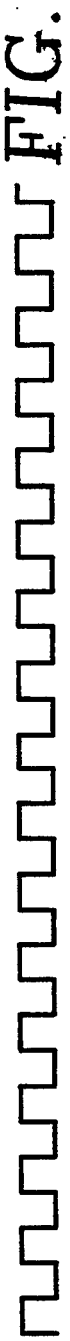
FIG. 4A VCO OUTPUT
FIG. 4B PHASE STATE OUT
FIG. 4C LOOP X-OR GATE OUT
FIG. 4D INCOMING SIGNAL
FIG. 4E SYNCHRONIZED BLANKING WINDOW GENERATOR OUT
FIG. 4F SWITCH OUT
FIG. 4G FILTER/HOLD UNIT OUT

PHASE LOCK LOOP CIRCUIT FOR SIGNALS PERIODICALLY INVERTING IN PHASE

BACKGROUND OF THE INVENTION

1. Technical Field

This invention relates to a phase lock loop circuit, and more particularly to a phase lock loop circuit for use where an incoming signal, which is to be tracked, periodically shifts in phase by 180 degrees.

2. Background Art

Phase lock loop (PLL) circuits are well known in the art. The circuit is used to produce a reference signal having a pre-determined frequency and phase relationship to an incoming signal. Normally, this incoming signal does not periodically invert in phase. However, some applications would benefit from such an incoming signal. For instance, data could be encoded onto the signal via a series of phase reversals. One such application is that of a digitizer. Digitizer systems for use as input devices to computers are also well known in the art. In a typical digitizer system, a pointing device is moved over the sensing (or working) surface of a tablet wherein the sensing surface of the tablet defines the boundaries of an X-Y coordinate system. The position of the pointing device on the sensing surface of the tablet is usually determined by an electrostatic or electromagnetic sensing link.

Recently, "cordless digitizers" in which there is no connecting cable between the pointing device and the tablet have become popular. In an electro-magnetic version as manufactured by the assignee of this application, a digitizer tablet employs grid conductors for each of the two coordinate directions. A pointing device is the "driven" member and emits an alternating current (AC) magnetic field from its tip at a given frequency. The magnetic field emanations induce signals into the grid wires which are then used by tablet electronics to determine the location of the pointing device. In practice, first the grid conductors for one coordinate direction are individually selected by a selector device and the induced signal therein is sensed. Then the grid conductors for the other coordinate direction are similarly selected and sensed. The amplitude characteristics of the induced signal and its magnitude are used by the tablet electronics and logic to determine how close the pointing device is to the grid conductor being sensed. When all the grid conductors have been sampled, the location of the pointing device on the tablet's sensing surface is derived. This position determination process typically requires that a reference signal, having a known frequency and phase relationship to the signal transmitted by the pointing device, be generated in the digitizer tablet. The reference signal is used to demodulate the induced signal. This is where the aforementioned PLL circuit comes into play. The PLL circuit is used to generate the reference signal.

To allow the user of the digitizer to indicate when positional information is being transmitted from the pointing device to the tablet, the pointing device usually has one or more manually-operated buttons associated with it. Typically, when the user wishes to transmit such information or data, one of the buttons is depressed. The pointing device then transmits an encoded signal to the digitizer tablet. The tablet electronics senses the encoded signal and performs whatever function is associated with that code.

Many different encoding schemes have been employed to transmit the aforementioned code in a cordless digitizer. Among these are Frequency Shift Keying (FSK), Phase Shift Keying (PSK), and Amplitude Modulation (AM), and variations thereof. These encoding schemes generally modify the basic pointing device signal in some way so as to create a binary code decodable by the digitizer electronics. As suggested above, one possible PSK encoding scheme might involve shifting the phase of the signal transmitted by the pointing device by 180 degrees, at known intervals, to represent data bits. For instance, if the phase in the pointing device signal is unchanged from the last known interval, this no-change condition could represent one binary state. If the phase had changed, however, the condition would then represent the other binary state. Accordingly, a binary encoded message may be transferred from the pointing device to the tablet for decoding by the digitizer logic circuits via this phase change method. Of course, this encoding method need not be limited to binary encoding. For instance, pre-determined patterns of phase reversals could be used to represent a plurality of different informational packets.

However, a problem in employing a phase inverting signal arises. A typical phase lock loop circuit responsible for generating the required reference signal would become unstable during the times it attempts to match phase reversals in the reference signal. This instability is caused when a voltage controlled oscillator (VCO), which is normally a part of the circuit, is driven to invert the phase of its output to match that of the pointing device's signal. During the time it takes for this phase change to occur, the reference signal will not be at a known phase relationship to the pointing device's signal. Therefore, it can not be used for its intended demodulation purposes.

It is, therefore, an object of the present invention to provide the architecture for a phase lock loop circuit whose output remains stable and closely tracks an incoming signal, even when the incoming signal is shifted in phase by 180 degrees.

It is another object of the present invention to provide the architecture for a phase lock loop circuit which outputs a signal indicating when a phase reversal has occurred in the incoming signal.

It is yet another object of the present invention to provide the architecture for a phase lock loop circuit to be used in a digitizer which outputs a signal indicating that data is being transmitted via a series of phase reversals in the incoming signal, instead of positional information.

In addition, other objects and benefits of the invention will become apparent from the detailed description which follows hereinafter when taken in conjunction with the drawing figures which accompany it.

SUMMARY

The foregoing objects has been attained generally by an architecture for a phase lock loop (PLL) circuit which includes an input for inputting an incoming signal which is to be tracked, a phase lock loop subcircuit, a phase state indicator subcircuit, and a synchronized blanking window generator. The phase lock loop subcircuit is used to maintain a voltage controlled oscillator (VCO) at a known phase relationship to the incoming signal, as initially input, even though the incoming signal may shift in phase by 180 degrees at known intervals subsequent to an initial phase shift. The phase lock loop subcircuit also outputs a reference signal which substantially matches the phase of the incoming signal except within a pre-determined amount of time subsequent to each 180 degree phase shift in the incoming signal.

The phase state indicator subcircuit is used to generate, in the aforementioned pre-determined amount of time, an indicator signal indicating the incoming signal has shifted in phase by 180 degrees, and to provide the indicator signal to the phase lock loop subcircuit for use in maintaining the VCO and outputting the reference signal.

The synchronized blanking window generator is used for generating a blanking window signal which includes a series of periodic pulses spaced apart in time such that the beginning of each one of the periodic pulses coincides with the beginning of one of the known intervals in which the incoming signal may shift in phase by 180 degrees. These periodic pulses further have a duration at least equal to the aforementioned pre-determined amount of time. The phase lock loop subcircuit uses this blanking window signal to stabilize the VCO. During the aforementioned pre-determined amount of time subsequent to each 180 degree phase shift in the incoming signal, the phase lock loop subcircuit maintains the VCO at a known phase relationship to the incoming signal, as initially input, by ignoring the incoming signal and internally generating a control signal which is fed into the VCO. The phase lock loop subcircuit uses the blanking window signal to initiate and terminate this ignoring of the incoming signal and generating of the control signal.

The phase lock loop subcircuit, phase state indicator subcircuit, and synchronized blanking window generator, in joint operation, create a phase lock loop circuit whose output remains stable and closely tracks an incoming signal, even when the incoming signal shift in phase by 180 degrees. Therefore, a key objective of the present invention is realized. The phase state indicator subcircuit detects a phase reversal in the incoming signal. The signal indicating a reversal has taken place is then used to invert the output signal from the VCO in the phase lock loop subcircuit. In this way, the comparison between the incoming signal and the inverted VCO signal that takes place next in the phase lock loop subcircuit will be between two signals that are substantially in phase with each other. Any small difference in phase between the two signals due to drift results in corrective signal to the VCO. As can be seen, the VCO is not driven to match the inverted phase of the incoming signal. Rather, the VCO output is inverted and compared to the incoming signal. The VCO output, therefore, remains stable. However, there will be the short period of time (i.e. the aforementioned pre-determined amount of time) between the inversion of the incoming signal and the output of the indicating signal by the phase state indicator subcircuit. During this time, the VCO output signal is not inverted and the VCO would be driven toward the inverted phase of the incoming signal. The synchronized blanking window generator prevents this from happening. Upon the first occurrence of a 180 degree phase shift in the incoming signal, the synchronized blanking window generator begins outputting the aforementioned pulses synchronized with the phase shifts in the incoming signal and lasting at least until the indicator signal from the phase state indicator subcircuit is received by the phase lock loop subcircuit. As described above, the phase lock loop subcircuit uses the pulse to ignore the compared signals and to generate a substitute corrective signal to the VCO. Accordingly, any instability in the VCO is avoided except during the first occurrence of the phase inversion in the incoming signal.

The periodic pulses of the blanking window signal can also be made to begin a period of time prior to the beginning of the known interval and have a duration equal to the period of time prior to the beginning of the known interval, plus the pre-determined amount of time, plus a period of time after the expiration of the pre-determined amount of time. This provides a margin of safety on either end of the pulse to ensure the pulse coincides with a phase reversal in the incoming signal and the associated pre-determined amount of time it takes for the phase state indicator subcircuit to detect the reversal. The synchronized blanking window generator begins outputting this series of periodic pulses at the beginning of the known intervals in response to the first occurrence of the phase state indicator subcircuit signal indicating the incoming signal has shifted in phase by 180 degrees. Therefore, only the first instance of a phase reversal in the incoming signal is able to destablize the VCO, and only for the duration of the pre-determined amount of time it takes for the phase state indicator subcircuit to detect the shift. Thereafter, the VCO is immunized from phase reversals in the incoming signal.

To accomplish the above-described operation the phase state indicator subcircuit includes a gate device for outputting a signal indicating whenever the phase of the incoming signal differs from that of the reference signal output by the phase lock loop subcircuit. In addition, it includes an integrator device for detecting from the signal output from the gate device when the incoming signal becomes 180 degrees out of phase with the reference signal, and for subsequently outputting a triggering pulse after the aforementioned pre-determined amount of time. And finally, it also includes a phase state device for outputting the indicator signal. The indicator signal is made up of a first signal at a first voltage level and a second signal at a second voltage level. The indicator signal alternates between the first and second signals in response to the triggering pulse from the integrator device.

As for the phase lock loop subcircuit, it includes a phase detector device for outputting a digital corrective signal whenever the phase of the incoming signal differs from that of the reference signal. The digital corrective signal, once smoothed by a low pass filter, exhibits a voltage consistent with that needed to cause an included VCO to output a signal shifted in phase toward that of the incoming signal. Next, the phase lock subcircuit includes a switch device connected between an output of the phase corrector device and an input of the VCO for interrupting the corrective signal for the duration of a blanking window pulse input into a control input of the switch. A filter/hold unit connected between an output of the switch and the input to the VCO acts as a low pass filter when the corrective signal is not interrupted by the switch, and outputs a substitute corrective signal whenever the corrective signal is interrupted by the switch. This substitute corrective signal has a voltage level substantially that of the smoothed corrective signal just prior to its interruption by the switch. Finally, there is a gate device for outputting the reference signal comprising a copy of the signal output from the VCO. This reference signal is inverted by the gate device whenever said indicator signal indicates the incoming signal has shifted in phase by 180 degrees.

The above described PLL circuit can be employed in a digitizer where the incoming signal is the positional and data signal transmitted by the pointing device and induced in the digitizer tablet's sensing grids. In such a digitizer, data would be encoded onto the positional and data signal via 180 degree phase shifts. The PLL circuit would provide the reference signal needed to demodulate the signal induced in the digitizer tablet by the positional and data signal, and thereby determine the position of the pointing device on the tablet. In addition, the indicator signal from the phase state indicator subcircuit would be used to decode the data encoded on the positional and data signal. Further, the blanking window signal would be used by the digitizer tablet electronics to differentiate between periods when positional information is being provided in the positional and data signal from periods when data is being provided. Accordingly, two more of the previously identified objectives of the present invention are realized.

DESCRIPTION OF THE DRAWINGS

These and other features, aspects, and advantages of the present invention will become better understood with regard to the following description, appended claims, and accompanying drawings where:

FIGS. 2a-f are graphs of the contemporaneous waveforms of a loop exclusive-OR gate output signal, incoming signal, phase state exclusive-OR output signal, capacitor output, comparator output, and flip flop output, respectively, associated with the electrical circuit of FIG. 1.

FIGS. 3a-b are graphs of the contemporaneous waveforms of an integrator output signal and a synchronized blanking window generator output signal, respectively, associated with the electrical circuit of FIG. 1.

FIGS. 4a-g are graphs of the contemporaneous waveforms of a VCO output signal, phase state indicator output signal, loop exclusive-OR gate output signal, incoming signal, synchronized blanking window generator output signal, switch output, and filter/hold unit output signal, respectively, associated with the electrical circuit of FIG. 1.

DETAILED DESCRIPTION OF THE PREFERRED EMBODIMENT

Figure 1:
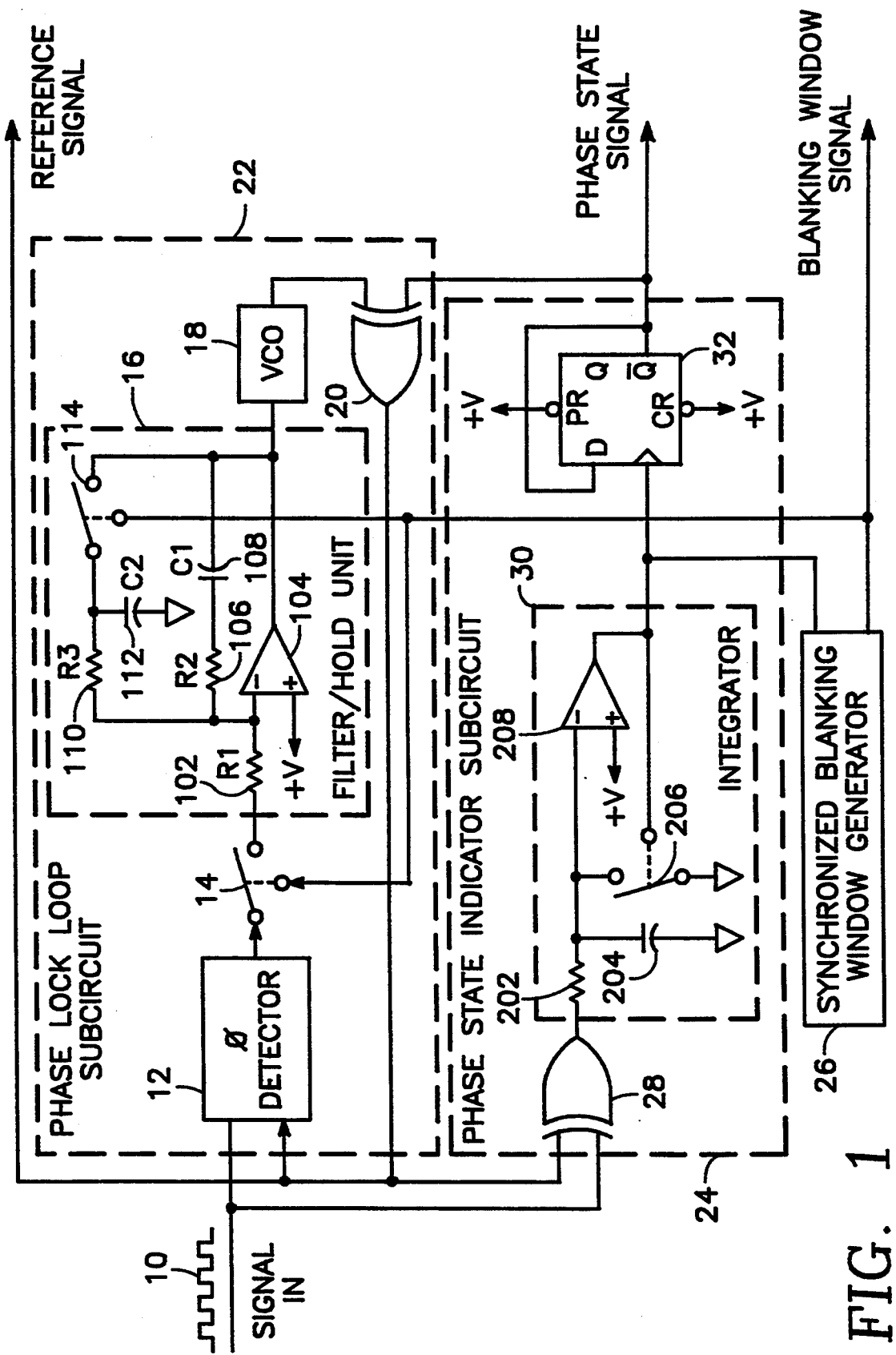
FIG. 1 is an electrical schematic diagram of an embodiment of the present invention.

A phase lock loop (PLL) circuit according to the present invention is shown in FIG. 1. An incoming signal 10 is fed into one input of a phase detector 12. The output of the phase detector 12 is connected to the input of a switch 14. The output of this switch 14 is in turn connected to the input of a filter/hold unit 16. The filter/hold unit 16 has two functions. First it is used to smooth a digital signal output from the phase detector 12 whenever the switch 14 is closed. This causes a continuous signal to be output from the unit 16. When the switch 14 is open, the filter/hold unit 16 is used to output a continuous signal having a constant voltage level approximately equal to the voltage that the aforementioned smoothed signal had just before the switch 14 was opened. However, this latter signal is generated by the filter/hold unit 16 itself, and not processed from the phase detector output signal. Preferably, the filter/hold unit 16 includes a first resistor 102 connected on one side to the output of the switch 14, and on the other side to the inverting input of an operational amplifier 104. The non-inverting input to the operational amplifier 104 is connected to a positive voltage source, preferably a voltage source maintained at approximately one-half the high logic level of the PLL circuit. The output of the operational amplifier 104 is fed back to its inverting input via two parallel branches. The lower branch includes a second resistor 106 connected on one side to the output of the first resistor 102, and on its other side to a first capacitor 108. The first capacitor 108 is connected on its opposite side to the output of the operational amplifier 104. The upper branch includes a third resistor 110 connected on one side to the output of the first resistor 102, and on its other side to a second capacitor 112. The opposite side of the second capacitor 112 is connected to ground. The side of the third resistor 110 connected to the capacitor 112 is also connected to one side of a switch 114. The other side of the switch 114 is connected to the output of the operational amplifier 104. The output of the filter/hold unit 16, which equates to the output of the operational amplifier 104 in the preferred version of the unit 16, is connected to the control input of a voltage controlled oscillator (VCO) 18. The output of this VCO 18 is in turn connected to one input of an exclusive-OR gate 20. The output of the gate 20 is connected to the other input to the phase detector 12. This completes the loop subcircuit 22 of the PLL circuit.

However, the above-described loop subcircuit 22 is influenced by two appending circuit elements. Namely, a phase state indicator subcircuit 24 and synchronized blanking window generator 26. The phase state indicator subcircuit 24 includes an exclusive-OR gate 28. The inputs to this exclusive-OR gate 28 are respectively tied to the incoming signal 10 and the output of the exclusive-OR gate 20 associated with the loop subcircuit 22. The output of this second exclusive-OR gate 28 is connected to an integrator 30. The integrator 30 is designed to ramp up to a pre-determined threshold voltage whenever the signal output by the exclusive-OR gate 28 indicates that the incoming signal 10 is 180 degrees out of phase with the signal output from the loop subcircuit's exclusive-OR gate 20. Once this threshold voltage is reached, the integrator 30 outputs a triggering pulse and resets itself. It will be recognized by those skilled in the art that a multitude of circuits could produce the just described integrator action. Any such circuit would be acceptable. However, it is preferred that the integrator consist of a resistor 202 which is connected to a first side of a capacitor 204. The other side of the capacitor 204 is connected to ground. The first side of the capacitor 204 is also connected to the input of a switch 206. The output of this switch 206 is connected to ground. Additionally, the input of the switch 206 is connected to the inverting input of a comparator 208. The non-inverting input to the comparator 208 is connected to a positive voltage source, preferably a voltage source maintained at approximately one-half the high logic level of the PLL circuit. The output of the comparator 208 is connected to the control input to the switch 206. When the output of the comparator 208 is high, the switch 206 is closed, thereby discharging the capacitor 204. When, the output of the comparator 208 is low, the switch 206 is open, and the capacitor 204 is allowed to charge. This output from the comparator 208 also constitutes the output from the integrator 30.

The output of the integrator 30 is connected to the triggering input of a D-type flip flop 32. The D input to this flip flop 32 is connected to its inverse Q output, thereby creating a feedback loop. This results in the inverse Q output changing logic states whenever the flip flop 32 is triggered by the output of the integrator 30. Finally, the inverse Q output of the flip flop 32 is connected to the second input to the exclusive-OR gate 20 associated with the loop subcircuit 22. It is this connection that causes the phase state indicator subcircuit 24 to influence the loop subcircuit 22. Essentially, when the inverse Q output is low, the signal output by the VCO 18 is passed through the exclusive-OR gate 20 unchanged. However, when the inverse Q output of the flip flop 32 is high, the VCO output signal is inverted by the exclusive-OR gate 20.

The output of the integrator 30 is also feed into the synchronized blanking window generator 26. The integrator's output is used to synchronize the generator 26 to the occurrence of a 180 degree phase shift in the incoming signal. After the initial synchronizing pulse is received from the integrator 30, the synchronized blanking window generator 26 outputs a series of high logic level pulses having a pre-determined duration and spacing. This output from the generator 26 is fed into the control input to the loop subcircuit's switch 14. When the output of the generator 26 is low, the switch 14 is closed. And, when the output of the generator 26 is high, the switch 14 is opened. In addition, the output from the generator 26 is fed into the control input of the filter/hold unit's switch 114, in the preferred version of the unit 16. Here again, the switch 114 is closed when the output of the generator 26 is low, and open when the output is high. This switching control function is how the synchronized blanking window generator 26 influences the loop subcircuit 22.

Generally, the loop subcircuit 22 is used to control the phase of the output from the VCO 18, as in all PLL circuits. However, the PLL circuit of FIG. 1 is designed to operate in an environment where the input signal 10 is periodically shifting in phase by 180 degrees. As explained previously, such a signal may be found in a digitizer system where data is transferred by encoding an input signal such that data bits are represented by the presence or absence of a 180 degree phase shift in the signal. As those skilled in the art will recognize, other applications where such a phase-shifting input signal to a PPL circuit is employed would equally benefit from the circuit of FIG. 1. To ensure the proper operation of the PLL circuit, the VCO 18 must be immunized from the phase inversion that is periodically occurring in the incoming signal 10. Otherwise, the loop subcircuit 22 would act to correct for the phase difference and the output of the VCO 18 would become unstable. This immunization is partially accomplished by the phase state indicator subcircuit 24. The phase state indicator subcircuit 24 is designed to invert the signal output from the VCO 18 whenever a 180 degree phase shift in the incoming signal 10 is detected. In this way the signals input into the phase detector 12 are approximately in phase with each other, except for any small lag or lead caused by drift in the signals due to noise, etc. This drift is, of course, corrected by the loop subcircuit 22. The phase state indicator subcircuit 24, as its name implies, has a secondary function as well. The output signal from this subcircuit 24 is used to indicate when a phase inversion in the incoming signal 10 has occurred. This signal can be used elsewhere to decipher data encoded on the incoming signal 10.

The synchronized blanking window generator 26 is also used to immunize the PLL circuit of FIG. 1 from the 180 degree phase shifts in the incoming signal 10. As will be discussed below, the phase shift detection process within the phase state indicator subcircuit 24 requires a few cycles of the incoming signal 10 before a phase inversion is detected. During this time period, the synchronized blanking window generator 26 opens the switch 14 in the loop subcircuit 22. Accordingly, the signal output by the phase detector 12 is blocked by the open switch 14 and never reaches the VCO 18, for those few cycles when the incoming signal 10 is inverted in respect to the signal output from the exclusive-OR gate 20 (i.e. prior to the latter signal being inverted by the phase state indicator subcircuit 24). Therefore, the loop subcircuit 22 does not attempt to correct for the 180 degree phase shift during the time the phase shift indicator circuit 24 is in the process of detecting it. The only exception is during the first occurrence of the phase inversion in the incoming signal 10. This first occurrence is used to initiate the blanking of future phase transition periods. However, since any instability caused in the VCO 18 just after the first occurrence of the phase inversion in the incoming signal 10 will only last a few cycles and occurs just once, it is not of great concern.

Having described the use and purpose of the loop subcircuit 22, phase state indicator subcircuit 24, and the synchronized blanking window generator 26, generally, the specific operation of these three elements of the PLL circuit of FIG. 1 will now be described in reference to FIGS. 2a–f, 3a–b, and 4a–g. The phase state indicator subcircuit 24 will be described first.

The signal output by the loop subcircuit's exclusive-OR gate 20 and the incoming signal 10 are fed into the exclusive-OR gate 28 of the phase state indicator circuit 24. If these two signals differ in phase, the gate 28 will output a high during those times the two signals are at opposite logic states. Such a situation occurs when the incoming signal is inverted in phase. The output from the exclusive-OR gate 28 is then fed into the integrator 30. The integrator 30 ramps up under the influence of a high output by the gate 28. If the high level signal is of sufficient duration, the integrator threshold is reached and the integrator 30 outputs a triggering pulse. The integrator 30 then resets itself so as to be ready to detect the next occurrence of a 180 degrees phase shift in the incoming signal 10. In addition, the integrator 30 ignores the case where the incoming signal 10 is slightly lagging or leading the signal output from the loop subcircuit's exclusive-OR gate 20 due to signal drift. The preferred integrator described above produces these desired attributes as follows. A low logic level signal from the exclusive-OR gate 28 has the effect of charging the capacitor 204 and placing the inverting input to the comparator 208 at this voltage. This corresponds to the case where the incoming signal 10 and the signal output from the loop subcircuit's exclusive-OR gate 20 are substantially in phase with each other, as shown in the far left side of FIGS. 2a–b. Since the non-inverting input to the comparator 208 is at approximately one-half the high logic level voltage, the comparator 208 will output a high when the inverting input is at the low logic level voltage. If the signal output from the loop subcircuit's exclusive-OR gate 20 is slightly leading or lagging the incoming signal 10 due to drift in the signals, the phase state indicator subcircuit's exclusive-OR gate 28 will put out some small amount of high logic level pulses, but the average voltage of the signal will still be close to the low logic level. Therefore, the capacitor will remains charged to approximately the low logic level voltage. Accordingly, a slight lag or lead caused by signal drift is substantially ignored by the circuit. When the incoming signal 10 inverts in phase, the output of the exclusive-OR gate 28 will go high, as shown in FIG. 2c. FIG. 2d illustrates how the capacitor 204 will begin to ramp up to this positive voltage. When the capacitor charges up to approximately one-half the high logic level voltage, the inverting and non-inverting inputs to the comparator 208 will be at the same voltage, and the comparator's output will go low. This is the threshold of the integrator 30. At that point, the low signal will close the integrator's switch 206. This will cause the capacitor 204 to discharge, thereby resetting the integrator 30. The net result is a low logic level pulse output from the comparator 208, as shown in FIG. 2e. This pulse is the integrator's triggering signal.

The length of time required for the capacitor 204 to ramp up to approximately one-half the high logic level voltage from the low logic level voltage depends on the time constant of the resistor 202 and capacitor 204 combination. The time constant can be pre-determined by adjusting the size of the resistor 202 and capacitor 204. Preferably, the time constant is set so as to require the output of the exclusive-OR gate 28 to remain high for approximately eight cycles of the incoming signal 10, as shown in FIG. 2b–c. The eight cycles is chosen to provide a high confidence that a phase reversal in the incoming signal has actually occurred, and not just a momentary shifting due to noise. If noise should mask one or two of the cycles, the capacitor 204 would still eventually ramp up the threshold voltage of one-half the high logic level and trip the comparator 208.

The triggering pulse output by the integrator 30 is fed into the triggering input of the D-type flip flop 32. As described above, this will cause the output of the flip flop 32 to change logic states. Such a transition is shown in FIG. 2f. Therefore, a transition of the flip flop output signal from either high to low, or low to high will indicate a 180 degree phase shift in the incoming signal. This indicating signal can then be used to decode data encoded on the incoming signal 10 via the phase shift techniques previously described. In addition, the signal will be used to stabilize the loop subcircuit 22, as will be described below.

The signal output from the integrator 30 is also fed into the synchronized blanking window generator 26. The triggering pulse of the integrator signal is used to synchronize the generator 26 to the occurrence of the phase reversal in the incoming signal 10, as shown in FIGS. 3a–b. Essentially, upon the first occurrence of a triggering pulse from the integrator 30, the generator 26 begins to output a series of high logic level pulses of pre-determined duration and spacing. These pulses constitute blanking windows for use in the loop subcircuit 22, and coincide with the occurrence of a phase reversal in the incoming signal. The pulses can be made to coincide because, as previously discussed, the phase reversals in the incoming signal 10 represent data and will occur at known, pre-determined intervals. In addition, whenever an integrator signal triggering pulse occurs subsequent to the initial one, the generator 26 can use it as feedback to ensure the blanking windows are properly coinciding with the phase reversals in the incoming signal 10, and adjust the duration or spacing of the windows if a mismatch is occurring. Preferably, the synchronized blanking window generator 26 is a microprocessor programmed via well known methods to output the blanking window pulses at the required times in response to the initial triggering pulse from the integrator 30. However, as will be recognized by those skilled in the art, alternate methods can be used to produce the required blanking windows. For instance, a chain of counters might be employed. It is also noted that in the application of the PLL circuit of FIG. 1 in a digitizer, the blanking window pulses can also be used by the digitizer tablet electronics as an indicator when data signals instead of positional signals are being transmitted. This has utility as the phase reversals would adversely effect the tablet electronics ability to determine the location of a pointing device. Accordingly, the tablet electronics can be programmed to ignore data signals for position determining purposes based on the indication from the synchronized blanking window generator 26 that such data signals are being sent.

Finally, with the operation of the phase state indicator subcircuit 24 and the synchronized blanking window generator 26 defined, the operation of the loop subcircuit 22 can now be discussed. The incoming signal 10 and the signal output from the loop subcircuit's exclusive-OR gate 20 are fed into the phase detector 12. This is a standard phase detector, well known in the art, which outputs a digital signal representative of the difference in phase between the two signals. This signal, when smoothed by the filter/hold unit 16, provides a corrective voltage input to the VCO 18, to force the VCO output signal into phase with the incoming signal. Consequently, any drift in the phase of the signals is continuously corrected.

Typically, whenever an incoming signal is shifted 180 degrees in phase, a phase detector would output a signal capable of forcing a VCO output to match this phase reversal. However, this would be undesirable for many applications. For instance in a digitizer, the VCO output circuit is often used to generate a stable reference signal for demodulating the incoming signal 10. If the VCO was forced to follow the phase reversals of the incoming signal, the phase of the output signal would fluctuate, and fail to provide a stable reference signal. Therefore, if the VCO signal were to reverse in phase to match the incoming signal, it could not be used as this aforementioned reference signal. In the case of the PLL circuit of FIG. 1, this circumstance is avoided. The phase state indicator signal output from the flip flop 32 inverts the output from the VCO 18 whenever the incoming signal inverts in phase, via the loop subcircuit's exclusive-OR gate. This is shown in FIGS. 4a–c. In this way, the phase detector 12 sees two signals which are in substantially in phase with each other, even when the incoming signal 10 undergoes a phase reversal. This can be seen in FIGS. 4c–d. Therefore, the correction signal output from the phase detector 12 will be such that the VCO output signal stays in phase with the original unaltered incoming signal and is not forced to match the phase inversions of the incoming signal 10. Thus, a stable VCO signal is maintained.

However, as FIGS. 4c–d also show, there is a period of time when the two signals are 180 degrees out of phase with each other. This period of time corresponds to the time it takes for the phase state indicator subcircuit 24 to recognize a phase reversal in the incoming signal 10, and output a signal indicating so. Therefore, if not prevented, the output from phase detector 12 would push the VCO signal's phase toward that of the inverted incoming signal. Granted, if the phase state indicator subcircuit 24 response time was limited to few cycles of the incoming signal, the change in the VCO output would be small. However, even a small transient can cause errors. For example, if the PLL circuit of FIG. 1 was used in a digitizer, the transient in a reference signal derived from the loop subcircuit 22 could cause errors in the demodulation of the incoming signal in associated with determining the position of a pointing device on the digitizer tablet. This is where the synchronized blanking window generator 26 comes into play. After the first transition in the incoming signal 10, blanking window signal pulses are output from the generator 26 to coincide with possible subsequent transitions in the incoming signal 10. The transitions in the incoming signal may or may not occur depending on the bit pattern being transmitted in the incoming signal, as discussed previously. However, the timing as to when a transition may occur is known. Therefore, the blanking window signal pulse is generated each time a transition may occur, even if such a transition does not happen.

The blanking window signal pulses are used to block the output of the phase detector 12 during the time it takes for the phase state indicator subcircuit 24 to recognize a phase reversal in the incoming signal 10. Since a pulse is generated every time a transition in the incoming signal occurs after the initial one, the aforementioned transient in the VCO output signal will only occur during the first phase reversal in the incoming signal. Therefore, any error is minimized.

The duration of each blanking window signal pulse is at least as long as the aforementioned period of time when the incoming signal 10 and the signal output by the loop subcircuit's exclusive-OR gate 20 would be 180 degrees out of phase from each other, if the incoming signal were to invert in phase. FIGS. 4c–e show a blanking window duration of 12 cycles. This corresponds to the approximately 8 cycles required for the phase state indicator subcircuit 24 to detect the phase reversal in the incoming signal 10 assuming the preferred integrator circuit described above is employed. An extra 2 cycles, before and after the aforementioned 8 cycle time period, is used as a safety margin. For instance, if noise masked one or two cycles of the incoming signal, thereby resulting in an extra one or two cycles for the integrator 30 to output its triggering signal, the blanking window pulse would still be sufficiently long enough to cover the full period when the incoming signal is 180 degrees out of phase with the reference signal.

The blanking window signal pulse causes the loop subcircuit's switch 14 to open, thereby preventing the signal from the phase detector 12, which would push the VCO output toward matching the phase of the inverted incoming signal, if present, from reaching the VCO 18. FIG. 4f shows the interrupted output from the switch 14. This is how the synchronized blanking window generator 26 prevents the aforementioned VCO instability. If a 180 degree phase shift does not occur in the incoming signal at one of the appointed intervals, the blanking window pulse will still open switch 14 for the duration of the pulse. However, as will be seen, these periods when the switch 14 is open, will have little effect on the stability of the VCO output.

A control signal must still be provided to the VCO 18 for it to operate correctly during the time the switch 14 is open. Accordingly, a substitute control signal is supplied by the filter/hold unit 16. When the filter/hold unit's switch 114 (along with the loop subcircuit's switch 14) is closed, the previously described architecture of the preferred version of the unit 16 operates as an active low pass filter to smooth the signal output from the phase detector 12. This architecture is typical of such filters, with the exception of the second capacitor 112 and switch 114 included in the upper branch of the operational amplifier's feedback loop. The addition of the second capacitor 112 is simply to suppress any signal spikes that may be caused by the operation of the switch 114, whereas the switch is added to convert the filter into a hold circuit. The conversion takes place when the loop subcircuit's switch 14 and the filter/hold unit's switch 114 are opened via a blanking window pulse. All paths for current to leave the first capacitor 108 are cut off. With the filter/hold circuit in this condition, the voltage at the output of the operational amplifier 104 is held to the approximate voltage existing there just prior to the switches 14, 114 opening. The signal output by the operational amplifier 104 will remain at that voltage level until the switches 14, 114 are closed again at the termination of the blanking window pulse. This just-described sensing of the opening of the loop subcircuit switch 14 by the filter/hold unit 16, and outputting of a signal having a voltage approximately equal to the voltage of the control signal output from the phase detector 12 just prior to the opening of the switch 14, is shown in FIG. 4g. Because the filter/hold unit's output signal voltage is held, the phase of the VCO output signal existing just prior the opening of the switch 14 will be maintained for the duration of the blanking window signal pulse. Once the switch 14 is closed again, after the termination of the blanking window signal pulse, any drift in the phase of the VCO signal compared to the incoming signal 10 will be compensated for by the signal from the phase detector 12.

Accordingly, a PLL circuit is created which can provide an ultra-stable reference signal having substantially the same phase as the incoming signal, even though the incoming signal is periodically inverting in phase. In addition, this PLL circuit provides a signal indicating when the incoming signal has inverted in phase so that data encoded on the incoming signal, via these phase shifts, can be decoded.

While the invention has been described in detail by reference to the preferred embodiment described above, it is understood that variations and modifications thereof may be made without departing from the true spirit and scope of the invention.

Wherefore, what is claimed is:

1. A phase lock loop circuit comprising:
   (a) an input for inputting an incoming signal;
   (b) phase lock loop means for using the incoming signal to maintaining a voltage controlled oscillator at a known phase relationship to the incoming signal as initially input even though the incoming signal may shift in phase by 180 degrees at known intervals subsequent to an initial phase shift, and for outputting a reference signal which substantially matches the phase of the incoming signal except within a pre-determined amount of time subsequent to each 180 degree phase shift in the incoming signal; and,
   (c) phase state indicator means for generating in said pre-determined amount of time an indicator signal indicating the incoming signal has shifted in phase by 180 degrees, and providing the indicator signal to the phase lock loop means for use by the phase lock loop means in maintaining the voltage controlled oscillator and outputting the reference signal.

2. A phase lock loop circuit in accordance with claim 1, and further comprising:
(a) synchronized blanking window generator means for generating a blanking window signal which includes a series of periodic pulses spaced apart in time such that the beginning of each one of the periodic pulses coincides with the beginning of one of the known intervals in which the incoming signal may shift in phase by 180 degrees, said periodic pulses further having a duration equal to said pre-determined amount of time; and wherein,
(b) during said pre-determined amount of time subsequent to each 180 degree phase shift in the incoming signal, the phase lock loop means is able to maintaining the voltage controlled oscillator at a known phase relationship to the incoming signal as initially input by ignoring the incoming signal and internally generating a control signal which is fed into the voltage controlled oscillator using the blanking window signal to initiate and terminate said ignoring of the incoming signal and generating of the control signal.

3. A phase lock loop circuit in accordance with claim 2, wherein:
the periodic pulses of the blanking window signal begin a period of time prior to the beginning of the known interval and have a duration equal to the period of time prior to the beginning of the known interval, plus the pre-determined amount of time, plus a period of time after the expiration of the pre-determined amount of time.

4. A phase lock loop circuit in accordance with claim 2, wherein:
the synchronized blanking window generator means begins outputting the series of periodic pulses at the beginning of the known intervals in response to the first occurrence of the signal output by the phase state indicator means indicating the incoming signal has shifted in phase by 180 degrees.

5. A phase lock loop circuit in accordance with claim 1, wherein the phase state indicator means comprises:
(a) a gate means for outputting a signal indicating whenever the phase of the incoming signal differs from that of the reference signal output by the phase lock loop means;
(b) an integrator means for detecting from the signal output from the gate means whenever the incoming signal becomes 180 degrees out of phase with the reference signal, and subsequently outputting a triggering pulse after said pre-determined amount of time; and,
(c) a phase state means for outputting said indicator signal, wherein the indicator signal comprises a first signal at a first voltage level and a second signal at a second voltage level, said indicator signal alternately switching between the first and second signals in response to the triggering pulse from the integrator means.

6. A phase lock loop circuit in accordance with claim 2, wherein the phase lock loop means comprises:
(a) a phase detector means for outputting a digital corrective signal whenever the phase of the incoming signal differs from that of said reference signal, wherein the digital corrective signal, once smoothed by a low pass filter, exhibits a voltage consistent with that needed to cause the voltage controlled oscillator to output a signal shifted in phase toward that of the incoming signal;
(b) a switch means connected between an output of the phase detector means and an input of the voltage controlled oscillator for interrupting the corrective signal for the duration of a blanking window signal pulse input into a control input of the switch;
(c) a filter/hold unit means connected between an output of the switch and the input to the voltage controlled oscillator for acting as a low pass filter when the corrective signal is not interrupted by the switch, and for outputting a substitute corrective signal whenever the corrective signal is interrupted by the switch, said substitute corrective signal having a voltage level substantially that of the smoothed corrective signal just prior to its interruption by the switch;
(d) the voltage controlled oscillator; and,
(e) a gate means for outputting said reference signal comprising a copy of the signal output from the voltage controlled oscillator, which is inverted whenever said indicator signal indicates the incoming signal has shifted in phase by 180 degrees.

7. A digitizer with a digitizer tablet and a pointing device wherein a positional and data signal is passed between the digitizer tablet and the pointing device, and wherein the positional and data signal is demodulated via a reference signal generated in the digitizer tablet and is encoded via a series of 180 degree phase shifts in the positional and data signal, and including a phase lock loop circuit for generating the reference signal and indicating whenever a 180 degree phase shift has occurred in the positional and data signal, the phase lock loop circuit comprising:
(a) an input for inputting the positional and data signal;
(b) phase lock loop means for using the positional and data signal to maintaining a voltage controlled oscillator at a known phase relationship to the positional and data signal, as initially input, even though the positional and data signal may shift in phase by 180 degrees at known intervals subsequent to an initial phase shift, and for outputting the reference signal which substantially matches the phase of the positional and data signal except within a pre-determined amount of time subsequent to each 180 degree phase shift in the positional and data signal; and,
(c) phase state indicator means for generating in said pre-determined amount of time an indicator signal indicating the positional and data signal has shifted in phase by 180 degrees, and providing the indicator signal to the phase lock loop means for use by the phase lock loop means in maintaining the voltage controlled oscillator and outputting the reference signal.

8. A digitizer in accordance with claim 7, wherein:
the indicator signal is provided to decode the data encoded on the positional and data signal.

9. A digitizer in accordance with claim 7, wherein the phase lock loop circuit further comprises:
(a) synchronized blanking window generator means for generating a blanking window signal which includes a series of periodic pulses spaced apart in time such that the beginning of each one of the periodic pulses coincides with the beginning of one of the known intervals in which the positional and data signal may shift in phase by 180 degrees, said periodic pulses further having a duration equal to said pre-determined amount of time; and wherein, (b) during said pre-determined amount of time subsequent to each 180 degree phase shift in the positional and data signal, the phase lock loop means is able to maintaining the voltage controlled oscillator at a known phase relationship to the positional and data signal, as initially input, by ignoring the positional and data signal, and internally generating a control signal which is fed into the voltage controlled oscillator using the blanking window signal to initiate and terminate said ignoring of the positional and data signal, and generating of the control signal.

10. A digitizer in accordance with claim 9, wherein:
the periodic pulses of the blanking window signal begin a period of time prior to the beginning of the known interval and have a duration equal to the period of time prior to the beginning of the known interval, plus the pre-determined amount of time, plus a period of time after the expiration of the pre-determined amount of time.

11. A digitizer in accordance with claim 9, wherein:
the synchronized blanking window generator means begins outputting the series of periodic pulses at the beginning of the known intervals in response to the first occurrence of the signal output by the phase state indicator means indicating the positional and data signal has shifted in phase by 180 degrees.

12. A digitizer in accordance with claim 9, wherein:
the blanking window signal is further used by the digitizer tablet to differentiate between periods when positional information is being provided in the positional and data signal from periods when data is being provided.

13. A digitizer in accordance with claim 7, wherein the phase state indicator means comprises:
(a) a gate means for outputting a signal indicating whenever the phase of the positional and data signal differs from that of the reference signal output by the phase lock loop means;
(b) an integrator means for detecting from the signal output from the gate means whenever the positional and data signal becomes 180 degrees out of phase with the reference signal, and subsequently outputting a triggering pulse after said pre-determined amount of time; and,
(c) a phase state means for outputting said indicator signal, wherein the indicator signal comprises a first signal at a first voltage level and a second signal at a second voltage level, said indicator signal alternately switching between the first and second signals in response to the triggering pulse from the integrator means.

14. A digitizer in accordance with claim 9, wherein the phase lock loop means comprises:
(a) a phase detector means for outputting a digital corrective signal whenever the phase of the positional and data signal differs from that of said reference signal, wherein the digital corrective signal, once smoothed by a low pass filter, exhibits a voltage consistent with that needed to cause the voltage controlled oscillator to output a signal shifted in phase toward that of the positional and data signal;
(b) a switch means connected between an output of the phase detector means and an input of the voltage controlled oscillator for interrupting the corrective signal for the duration of a blanking window signal pulse input into a control input of the switch;
(c) a filter/hold unit means connected between an output of the switch and the input to the voltage controlled oscillator for acting as a low pass filter when the corrective signal is not interrupted by the switch, and for outputting a substitute corrective signal whenever the corrective signal is interrupted by the switch, said substitute corrective signal having a voltage level substantially that of the smoothed corrective signal just prior to its interruption by the switch;
(d) the voltage controlled oscillator; and,
(e) a gate means for outputting said reference signal comprising a copy of the signal output from the voltage controlled oscillator, which is inverted whenever said indicator signal indicates the positional and data signal has shifted in phase by 180 degrees.

* * * * *